United States Patent
Birgel et al.

(10) Patent No.: US 7,304,247 B2
(45) Date of Patent: Dec. 4, 2007

(54) CIRCUIT BOARD WITH AT LEAST ONE ELECTRONIC COMPONENT

(75) Inventors: Dietmar Birgel, Schopfheim (DE); Sergej Lopatin, Lörrach (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 158 days.

(21) Appl. No.: 10/478,295

(22) PCT Filed: May 18, 2002

(86) PCT No.: PCT/EP02/05512

§ 371 (c)(1),
(2), (4) Date: Jun. 7, 2004

(87) PCT Pub. No.: WO02/100140

PCT Pub. Date: Dec. 12, 2002

(65) Prior Publication Data

US 2005/0006140 A1    Jan. 13, 2005

(30) Foreign Application Priority Data

Jun. 1, 2001  (DE) ................ 101 26 655

(51) Int. Cl.
*H05K 1/16* (2006.01)

(52) U.S. Cl. ............. 174/260; 174/254; 174/262

(58) Field of Classification Search ........... 174/260, 174/262, 263, 264, 255, 253, 266; 361/792, 361/793, 794, 795; 310/348, 365, 366
See application file for complete search history.

(56) References Cited

U.S. PATENT DOCUMENTS 5,260,518 A * 11/1993 Tanaka et al. ............ 174/261
5,459,287 A * 10/1995 Swamy .................... 174/266
5,473,119 A * 12/1995 Rosenmayer et al. ..... 174/255

(Continued)

FOREIGN PATENT DOCUMENTS

DE        3636817        5/1988

(Continued)

OTHER PUBLICATIONS

"SMT Far-Blind Via-To-Pad-Connection" IBM Technical Disclosure Bulletin, IBM Corp., New York, US, Bd. 35, No., 7, Dec. 1, 1992.

(Continued)

*Primary Examiner*—Ishwar (I. B.) Patel
(74) *Attorney, Agent, or Firm*—Bacon & Thomas, PLLC

(57) ABSTRACT

A circuit board having, between the circuit board and a component arranged thereon, an electrical and mechanical connection of high mechanical-load-bearing ability. The circuit board includes at least one internally situated conductor path, a first insulating layer arranged on a first surface of the circuit board, a second insulating layer arranged on a second surface of the circuit board, a first contact location at which the conductor path is accessible, a second contact location, at which the conductor path is accessible through a bore passing completely through the circuit board, and an electronic component arranged on the first surface. The component has a first contact surface, which is connected with the first contact location by solder or electrically conductive adhesive, and a second contact surface which is connected with the second contact location by solder or adhesive.

5 Claims, 2 Drawing Sheets

U.S. PATENT DOCUMENTS

| | | | |
|---|---|---|---|
| 5,651,899 A * | 7/1997 | Schmidt et al. | 216/18 |
| 5,841,075 A * | 11/1998 | Hanson | 174/250 |
| 6,020,559 A | 2/2000 | Maeda | |
| 6,220,093 B1 | 4/2001 | Hirosawa | |
| 6,297,581 B1 * | 10/2001 | Yokoi | 310/368 |
| 6,376,051 B1 * | 4/2002 | Takezawa et al. | 428/209 |
| 6,472,610 B1 * | 10/2002 | Kawabata | 174/260 |
| 6,531,022 B1 * | 3/2003 | Tsukahara | 156/256 |
| 6,750,404 B1 * | 6/2004 | Anslow et al. | 174/262 |
| 6,782,616 B2 * | 8/2004 | Eldredge | 29/854 |

FOREIGN PATENT DOCUMENTS

| | | |
|---|---|---|
| DE | 10023220 | 11/2001 |
| EP | 0 117 809 A1 | 9/1984 |
| EP | 0 405 828 A1 | 1/1991 |
| EP | 0 702 404 A2 | 3/1996 |
| GB | 2 175 149 A | 11/1986 |
| JP | 08125317 A | 5/1996 |
| JP | 2000340923 A | 8/2000 |

OTHER PUBLICATIONS

Patent Abstracts of Japan, vol. 1998, No. 10, Aug. 31, 1998 & JP 10 135596 A, Iwaki Eectron Corp. Ltd.,.

Patent Abstracts of Japan, vol. 015, No. 022 (E-1024), Jan. 18, 1991 & JP 02 268488 A (Toshiba Corp.).

* cited by examiner

CIRCUIT BOARD WITH AT LEAST ONE ELECTRONIC COMPONENT

FIELD OF THE INVENTION

The invention relates to a circuit board with at least one electronic component and to a method for producing a connection between the circuit board and the component. The connection effects both the mechanical securement and the electrical connecting of the component on the circuit board.

BACKGROUND OF THE INVENTION

Electronic equipment, especially measuring instruments, exhibit, as a rule, at least one circuit board, on which electronic components are arranged. These components must be mechanically secured on the circuit board and be electrically connected to, in or on the conductor paths, or traces, extending on the circuit board.

Especially in the case of measuring instruments, which can experience very significant mechanical loadings, e.g. continuous vibrations from machines operating at a measuring location, it is particularly important that the electrical and mechanical connection between the components and the circuit board have a high load bearing ability.

Today, it is becoming increasingly frequent that flexible circuit boards are used, which e.g. are installed rolled up inside an electrical device, especially a measuring instrument, for saving space. Even for rigid circuit boards, it is very important to assure a mechanically loadable connection between the circuit board and the components mounted thereon. This is true, naturally, even more so, in the case of flexible circuit boards, where the connections get extra loading due to the deformability of the circuit board. Both during and following the rolling up of the circuit board, a reliable mechanical and electrical, highly loadable connection must be maintained.

EP-A 1069810 discloses a circuit board on which at least one electronic component is arranged. The component has at least two electrical contacts, of which a first contact is connected with a first terminal on the circuit board by bonding with a conductive adhesive and a second with a second terminal on the circuit board by soldering.

Solder and adhesive are placed on flat, mutually spaced contact surfaces on a surface of the circuit board. Then the component with its contact surfaces is placed on the surface such that the contact surfaces of the component cover the contact surfaces of the circuit board. This procedure provides a very efficiently manufacturable connection. Particularly this kind of solder connection is, however, sensitive to peel loadings.

SUMMARY OF THE INVENTION

It is an object of the invention to provide a circuit board with a least one electrical component, wherein a highly loadable electrical and mechanical connection exists between the circuit board and the component.

To this end, the invention comprises a circuit board with
  at least one internally situated conductor path,
  a first insulating layer arranged on a first surface of the circuit board,
  a second insulating layer arranged on a second surface of the circuit board,
  a first contact location at which the conductor path is accessible,
  a second contact location, at which the conductor path is accessible through a bore completely passing through the circuit board, and
  an electronic component arranged on the first surface,
    which exhibits a first contact surface, which is connected with the first contact location by solder or by an electrically conductive adhesive, and
    which exhibits a second contact surface, which is connected with the second contact location by solder or by adhesive.

Additionally, the invention comprises a circuit board with
  two mutually separated, mutually parallel, internally situated conductor paths,
  a first insulating layer arranged on a first surface of the circuit board,
  a second insulating layer arranged on a second surface of the circuit board,
  a first contact location at which the conductor path nearest the first surface is accessible,
  a second contact location, at which the conductor paths are accessible by a bore passing completely through the circuit board, and
  an electronic component arranged on the first surface,
    which exhibits a first contact surface, which is connected with the first contact location by solder or an electrically conductive adhesive, and
    which exhibits a second contact surface, which is connected with the second contact location by solder or adhesive.

In accordance with a further development, the bore has a metallizing in the region of the two conductor paths.

In accordance with a first embodiment, the conductor path at the first contact location is accessible through a cavity in the first insulating layer.

In accordance with a second embodiment, the conductor path is accessible at the first contact location through a bore completely passing through the circuit board.

In accordance with one embodiment, the component is a piezoelectric element, which has at least one flushly applied electrode, and the contact surfaces are portions of the electrode.

In accordance with one embodiment of the last-mentioned embodiment, the first and second contact surfaces electrically form a unit.

An advantage of the invention is that a peel loading acting on the mechanical connection between component and circuit board is transformed in the bore at least partially into a tensile load acting on the connecting material. Usual connecting materials, especially solders, are much more resistant to tensile loads, so that the presence of at least one such connection greatly improves the load-carrying ability of the connection.

The bore also offers a quality control opportunity. Simple observation from the side on which the component is not mounted permits checking whether the connecting material, thus solder or adhesive, is present in sufficient amount at the correct location.

The redundancy, which is provided by the first and second contact locations, offers additionally an increased reliability.

A further advantage of the connection technology of the invention is that it can be accomplished by machine. Exactly as is done in the populating of a circuit board with SMD-components, here also the connecting material, i.e. solder and/or adhesive, is applied by machine, e.g. by screen printing or with a dispenser. This is followed by a machine populating of the circuit board. The actual soldering step and the hardening of the adhesive can be done in one process step in a furnace. The simultaneous manufacturing of solder and adhesive connections is disclosed in the European Patent Application EP-A 1 069 810 of the applicant.

The invention and other advantages are explained in greater detail below on the basis of the figures of the drawing, where three examples of embodiments are presented; identical elements are given the same reference characters in the figures.

DESCRIPTION OF THE PREFERRED EMBODIMENTS

Figure 1:
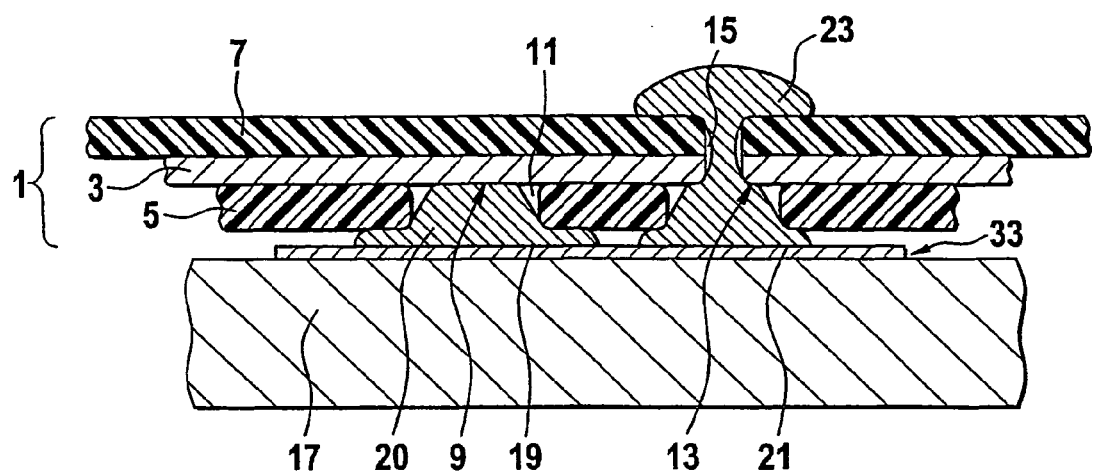
FIG. 1 shows schematically a circuit board with an internally situated conductor path and a component arranged thereon.

FIG. 1 shows schematically a circuit board with an internally situated conductor path 3. On a first surface of the conductor path 3, an insulating layer 5 is arranged, while a second insulating layer 7 is arranged on a second surface of the conductor path 3.

The circuit board 1 can be e.g. a flexible circuit board with a conductor path 3 of copper. The insulating layers 5, 7 can be e.g. polyimide films. Alternatively, the circuit board 1 can be a commercially usual, rigid circuit board, of e.g. an epoxy-resin-based insulating material.

The circuit board 1 has a first contact location 9 on the conductor path 3, at which the conductor path 3 is accessible through a cavity 11 in the first insulating layer 5. Additionally, the circuit board 1 has a second contact location 13 on the conductor path 3, at which the conductor path 3 is accessible through a bore 15 passing completely through the circuit board 1.

On the first surface of the conductor path 3, an electronic component 17 is arranged. The component 17 has a first contact surface 19, which is connected with the first contact location 9 by solder or an electrically conductive adhesive. For this purpose, a connection material 20, here a solder dot or an adhesive dot, is placed on the contact surface 19. When the component 17 is applied, the connection material 20 enters the cavity 11 and produces there an electrically conductive connection of the contact surface 19 to the section of conductor path 3 exposed by the cavity 11. The soldering or adhesive bonding creates a mechanically strong connection between the circuit board 1 and the component. The connection material 20 is enclosed in the cavity 11 and cannot escape during production of the connection. This type of connection offers, consequently, superioe contact reliability.

Additionally, component 17 has a second contact surface 21, which is connected with the second contact location 13 by a soldering or an adhesive bonding. Also in this case, a connection material 23, here a solder dot or an adhesive dot, is applied on the contact surface 21. When the component 17 is applied, the connection material enters into the bore 15 and produces an electrically conductive connecting of the contact surface 21 to the section of the conductor path 3 exposed by the bore 15. Excess connection material 23 exits through the bore 15. The soldering or adhesive bonding creates a mechanically strong connection between the circuit board 1 and the component. Due to the large surface wetted with the connection material 23, this connection has a very high load bearing ability.

The choice of connection materials depends here on various factors. If the contact surfaces 19, 21 are made of a material, such as e.g. nickel-copper, to which solder does not attach well, then a conductive adhesive is always used; on the other hand, if the contact surfaces 19, 21 are made of a material, e.g. silver, that permits both connection materials, then the connection material is chosen on the basis of its temperature resistance and its mechanical strength. Investigations have shown that an electrically conductive adhesive is preferred in cavity 11 for achieving a high contact reliability and a solder in the bore 15 for achieving a high mechanical strength.

Especially solder connections are sensitive to peeling loads. However, in the case of a connection practice, such as that present at the second contact location 13, a peeling load acting on the circuit board 1 partly becomes a tensile load on the solder located in the bore 15. Against tensile loads, a solder connection is, however, very much more resistant. The result is that the connection technology provided here assures a very high mechanical strength.

Additionally, this form of connection offers the advantage that the manufacturing process facilitates quality control. Thus, one can check whether connection material 23 has come out of the bore 15, or at least can be seen through the bore 15 from the second surface, in order to determine whether a sufficient amount of connection material has been applied.

Figure 2:
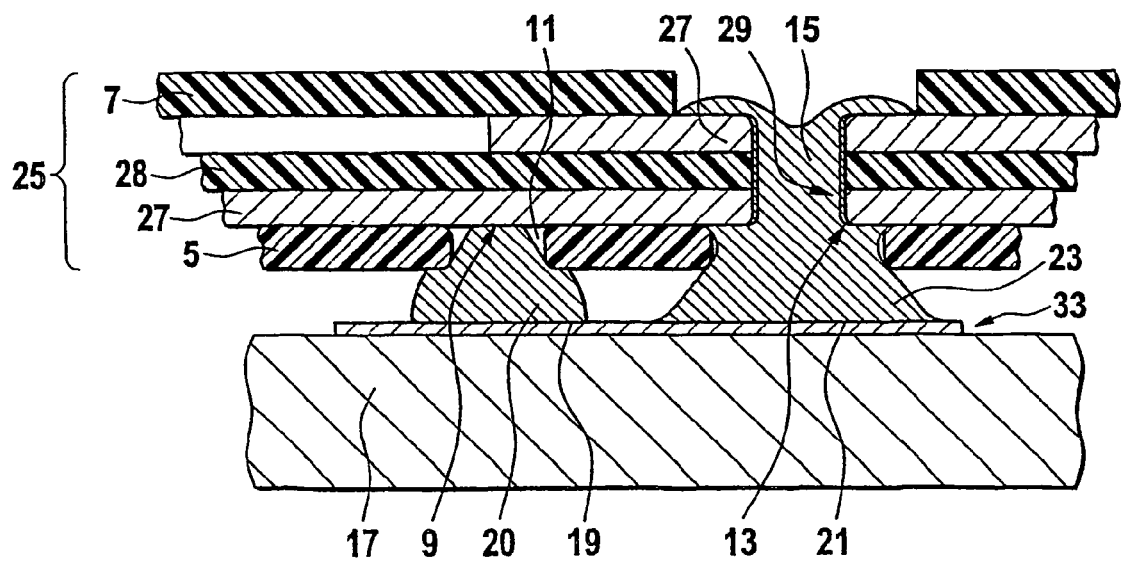
FIG. 2 shows schematically a circuit board with two conductor paths situated one above the other within the circuit board and a component arranged thereon.

FIG. 2 shows a further embodiment in a circuit board 25 of the invention. Because much is the same as in the preceding embodiment, the following discussion will detail only the differences.

Circuit board 25 can be provided with components on both sides. It has two mutually separated, mutually parallel, internally situated conductor paths 27. Along with the two outer insulating layers 5, 7, circuit board 25 exhibits additionally an inner insulating layer 28 extending between the two conductor paths 27.

Analogously to the situation in the preceding embodiment, circuit board 25 has a first contact location 9 where the conductor path 27 nearest the first insulating layer 5 is accessible through a cavity 11 in the first insulation layer 5.

Likewise analogously to the situation in the preceding embodiment, circuit board 25 has a second contact location 23, where the conductor paths 27 are accessible through the bore 15 passing completely through the circuit board 25. Bore 15 has a metallizing 29 in the region of the two conductor paths 27, by way of which the conductor paths are electrically connected together.

The electronic component 17 is arranged on the first surface and its first contact surface 19 is connected with the first contact location 9 by solder or an electrically conductive adhesive. The second contact surface 21 is connected with the second contact location 13 by solder or adhesive. The metallizing offers the advantage that the large surface which it causes is used optimally as contact area.

Figure 3:
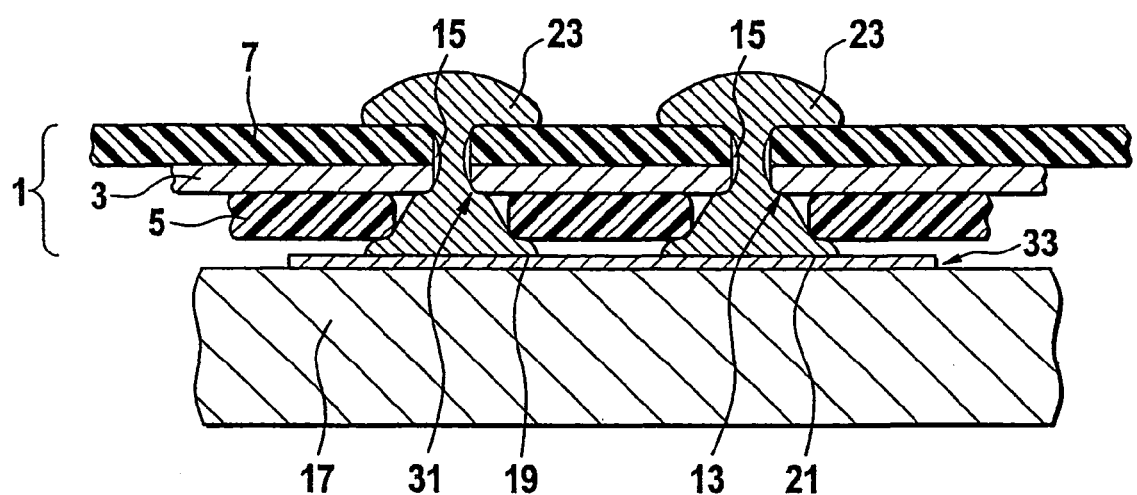
FIG. 3 shows schematically a circuit board with an internally situated conductor path and a component connected therewith, with a mechanical connection of very high load carrying ability.

FIG. 3 shows a further embodiment. Because much is the same as in the embodiment presented in FIG. 1, the following discussion will detail only the differences.

In the embodiment of FIG. 3, the circuit board 1 has a first contact location 31, where the conductor path 3 is accessible through a bore 15 passing completely through the circuit board 1, and it has a second contact location 13, where the conductor path 3 is likewise accessible through a bore 15 passing completely through the circuit board 1. The connection of the contact surfaces 19, 21 of the component 17 with the first and second contact locations 31, 13 is accomplished also in this case by solder or adhesive. The provision of two contact locations 31, 13 with bores 15 offers a particularly high ability to withstand mechanical loading, and is always preferably used, when extreme mechanical loadings are to be expected.

Thus, according to the invention, as described on the basis of the examples of embodiments, the circuit board 1 is electrically and mechanically connected with the component 17 both by way of a first contact location 9, 31 connected with a first contact surface 19 and by way of a second contact location 13 connected with a second contact surface 21, and at least one contract location 13 includes a bore 15 completely passing through the circuit board 1, or 25, as the case may be, to provide access to the conductor path 3, or the conductor paths 27, also as the case may be.

In the embodiments of the figures, component 17 is a piezoelectric element, which exhibits at least one flushly applied electrode 33. The contact surfaces 19, 21 are portions of the electrode 33. Thus, the first and second contact surfaces 19, 21 form electrically a unit. Consequently, a redundancy is present which provides an increased safety, or reliability.

The invention claimed is:

1. A circuit board, comprising:
 at least one conductor path defining a first surface, a second surface and a bore passing through said at least one conductor path between said first surface and said second surface;
 a first insulating layer arranged on said first surface and defining a cavity extending to said first surface, and also defining an extension of said bore;
 a second insulating layer arranged on said second surface;
 a first contact location on said first surface at which said conductor path is accessible through said cavity;
 a second contact location on said first surface at which said conductor path is accessible through the extension of said bore; and
 an electric component arranged to contact said first surface through said cavity and the extension of said bore, by an electrically conductive adhesive passing through said cavity into contact with said first contact location, and by one of: solder and an electrically conductive adhesive passing through the extension of said bore into contact with said second contact location, wherein:
 the circuit board is flexible; and
 said first contact location and said second contact location electrically form a unit with said electronic component.

2. The circuit board as defined in claim 1, wherein:
 said electronic component is a piezoelectric element, which has at least one flushly applied electrode; and
 said contact surfaces are portions of said flushly applied electrode.

3. A circuit board, comprising:
 two mutually separated, mutually parallel, internally situated conductor paths each defining a first surface, a second surface and a bore passing through said two conductor paths between their first and second surface;
 a first insulating layer arranged on the first surface of one of said conductor paths and defining a cavity and an extension of said bore;
 a second insulating layer arranged on the second surface of the other of said conductor paths;
 a first contact location on said first surface at which one of said conductor paths is accessible through said cavity;
 a second contact location on said second surface, at which said other of said conductor paths is accessible through said bore; and
 an electronic component arranged to contact said first surface, by one of: solder and electrically conductive adhesive passing through said cavity into contact with said first contact location, and to contact said second surface, by one of: solder and adhesive, passing through said bore into contact with said second contact location wherein:
 the circuit board is flexible; and
 said first and second contact locations electrically form a unit with said electronic component.

4. The circuit board as defined in claim 3, wherein:
 said bore has a metallizing in the region of said two conductor paths.

5. The circuit board as defined in claim 3, wherein:
 said electronic component is a piezoelectric element, which has at least one flushly applied electrode; and
 said contact surfaces are portions of said flushly applied electrode.

* * * * *